United States Patent [19]
Richardson

[11] 3,981,440

[45] Sept. 21, 1976

[54] DIGITAL SIGNAL DETECTOR

[75] Inventor: Alexander Laidlaw Richardson, Livingston, N.J.

[73] Assignee: International Telephone and Telegraph Corporation, Nutley, N.J.

[22] Filed: Sept. 25, 1974

[21] Appl. No.: 508,926

[52] U.S. Cl. ........................ 235/92 FQ; 235/92 CC; 235/92 TF; 235/92 PC; 328/111

[51] Int. Cl.$^{2}$ ............................................ H03K 5/20

[58] Field of Search..................... 328/111; 307/234; 235/92 FQ, 92 TF, 92 PC

[56] References Cited

UNITED STATES PATENTS

| | | | |
|---|---|---|---|
| 3,581,066 | 5/1971 | Maure et al. | 235/92 CC |
| 3,667,054 | 5/1972 | Nelson | 328/111 |
| 3,714,645 | 1/1973 | Sivertson, Jr. | 235/92 FQ |
| 3,728,635 | 4/1973 | Eisenberg | 235/92 CC |
| 3,790,881 | 2/1974 | Smith | 328/111 |
| 3,840,174 | 10/1974 | Craft | 235/92 CC |

*Primary Examiner*—Leo H. Boudreau
*Attorney, Agent, or Firm*—John T. O'Halloran; Peter Van Der Sluys; Vincent Ingrassia

[57] ABSTRACT

An apparatus is provided for detecting digital pulses or pulse intervals and any combination thereof. Logic means is provided wherein the complement of the interval to be measured is loaded into a digital counter, and certain states of this counter are decoded to set and reset, respectively, an in-bin flip-flop. Operation is initiated when a digital input is received. If the interval to be measured terminates while the in-bin flip-flop is set, an output is generated indicating that a "hit" has been scored and the parameters of the measurement can be read out. Code words stored in a memory provide the specific parameters of measurement, and particular portions of the code words are employed depending on the desired mode of operation. Each code word contains data corresponding to the interval to be measured, desired resolution, clock rate to be employed, end of cycle in cases where a pattern of pulses and intervals is to be detected, and an indication of whether a pulse or an interval between pulses is to be measured.

6 Claims, 1 Drawing Figure

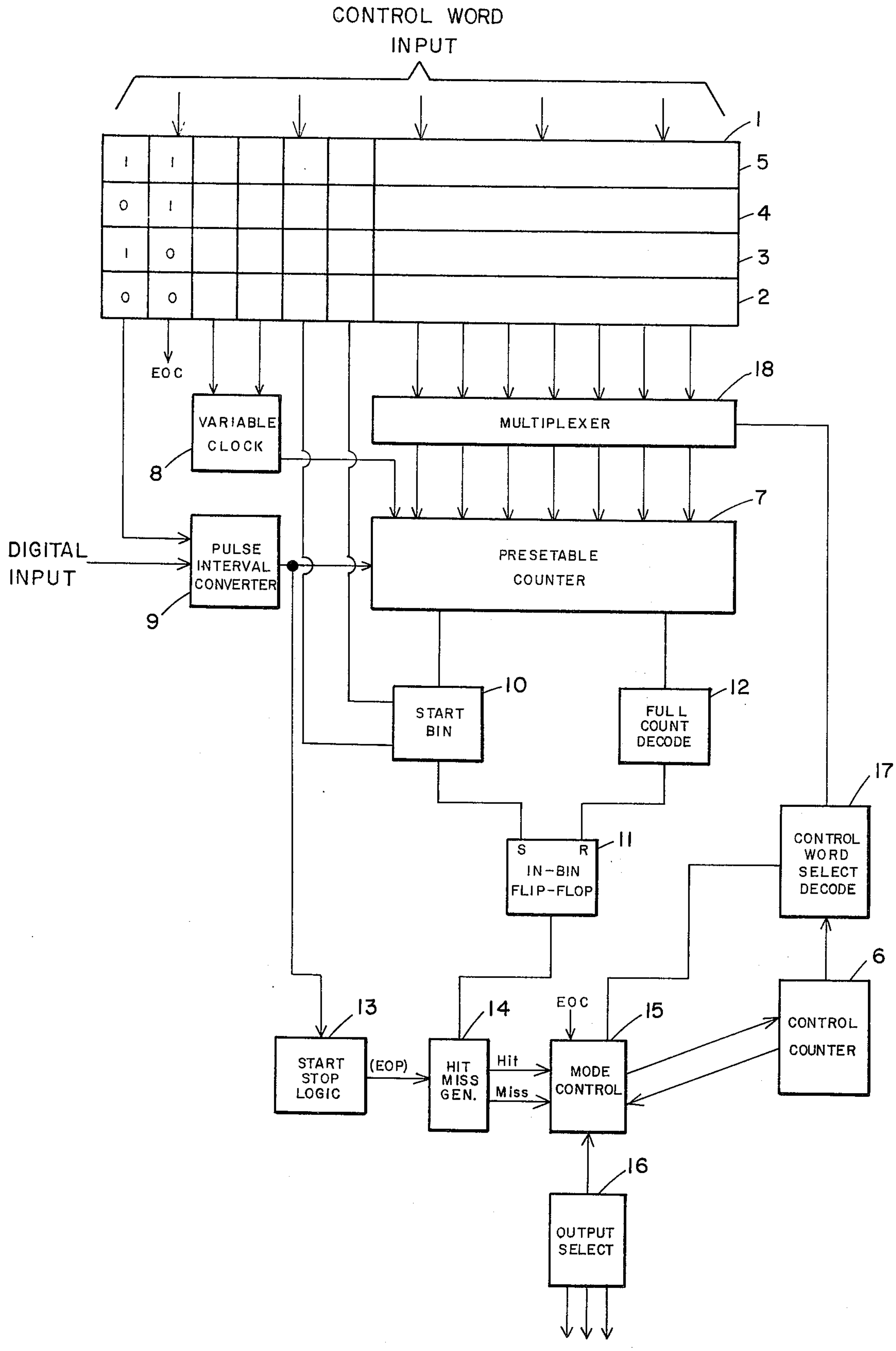
CONTROL WORD
INPUT
1
5
4
3
2
EOC
VARIABLE CLOCK
8
MULTIPLEXER
18
7
DIGITAL INPUT
PULSE INTERVAL CONVERTER
9
PRESETABLE COUNTER
START BIN
10
FULL COUNT DECODE
12
S R
IN-BIN FLIP-FLOP
11
CONTROL WORD SELECT DECODE
17
CONTROL COUNTER
6
START STOP LOGIC
13
(EOP)
HIT MISS GEN.
14
Hit
Miss
EOC
MODE CONTROL
15
OUTPUT SELECT
16

DIGITAL SIGNAL DETECTOR

BACKGROUND OF THE INVENTION

This invention relates to an apparatus for detecting digital signals and more particularly, to an apparatus for recognizing a plurality of signals having different pulse widths or pulse repetition intervals, including signals in which the parameters vary in time, commonly known as "stagger".

The detection of digital signals having predetermined pulse widths and pulse repetition intervals is well known and has applications in many areas; for example, Tacan, IFF and Communication Systems such as Link-4 and Link-11 wherein it is required to recognize a number of pulses having different pulse widths and repetition rates. To achieve the above described recognition, various arrangements of counters and decoders, as well as tapped delay lines, have been employed to measure time and to indicate when a particular time interval or sequence of time intervals has occurred. While satisfactory in operation, the known arrangements generally require fixed time interval parameters. At best, only slight parameter variation is achieved, and these must be provided for by wiring the capability into the system beforehand. Therefore, these arrangements are restricted to the detection of a particular class of signals.

SUMMARY OF THE INVENTION

It is an object of the present invention to provide an apparatus for detecting digital signals wherein the parameters governing detection can be easily and electronically varied, thereby permitting a single detector to serve a variety of functions on a time-shared basis.

According to a broad aspect of the invention, there is provided an apparatus for recognizing a plurality of digital signals having different pulse widths or pulse repetition intervals comprising: a presettable digital counter; a first source of digital signals corresponding to the binary complement of the interval to be measured, said first source coupled to said presettable counter; a second source of digital input signals to be measured; logic means coupled to said presettable counter for generating a signal corresponding to an acceptable time interval within which a desired input interval must end; means coupled to said second source for indicating when an input interval has terminated; means for generating an output when said indication occurs during said acceptable time interval; and means for varying said acceptable time interval.

BRIEF DESCRIPTION OF THE DRAWING

The above and other objects of the present invention will be more clearly understood from the following detailed description taken in conjunction with the accompanying drawing, in which the sole FIGURE is a functional block diagram of the inventive signal detector.

DESCRIPTION OF THE PREFERRED EMBODIMENTS

The signal detector shown in FIG. 1 measures the width of a pulse or interval between pulses by counting clock pulses in a conventional manner. The interval to be measured may be a single pulse or an interval between pulses which has been converted to a single gate pulse by means of a flip-flop, for instance.

The arrangement shown in FIG. 1 contains a memory 1 for storing code words 2, 3, 4 and 5. It should be understood at the outset that the memory may contain a large number of code words. Only four have been shown in the drawing for the sake of clarity and to facilitate an understanding of the operation of the device. Each code word contains, in digital form, information corresponding to the interval to be measured, the desired resolution at which measurement is to take place, clock pulse rate, an indication of end of cycle as will be more fully described below, and an indication of whether a pulse width or a pulse interval is to be measured. Clearly, the number of bits assigned to each of these information areas is arbitrary.

In the initial state, control counter 6 is preset to zero, and action is initiated by loading presettable counter 7 via multiplexer 18 with binary information from the first code word 2, which information corresponds to the complement of the true binary representation of the desired interval. The rate at which counter 7 will count is determined by the output of variable clock pulse generator 8, also controlled by information in code word 2. If the last bit of code word 2 is "0", it indicates that an interval between pulses is to be measured. Therefore, the last bit and the digital input signal act upon pulse interval converter 9 to create a gate pulse corresponding to the pulse repetition interval of the input signal. If the last bit had been "1", indicating that the input pulse width is to be measured, the input signal would not be acted upon by pulse interval converter 9 and would pass unchanged through converter to the input of presettable counter 7.

When the gate pulse formed by pulse interval converter 9 begins, counter 7 begins counting at a rate dependent upon the output of variable clock pulse generator 8, which in turn is controlled by code word 2. Start bin logic 10 under the control of the resolution bits in the code word, detects the count corresponding to the minimum acceptable pulse width and generates an output at the minimum count which sets in-bin flip-flop 11. Start bin logic 10 may consist of a simple decoder or digital counter. Counting continues after the in-bin flip-flop 11 is set. The full count detector 12 generates an output which resets in-bin flip-flop 11 when counter 7 has reached full value. Again, the full count detector 12 may consist of a simple decoder circuit.

When the gating interval stops, start-stop logic 13 generates an end of pulse signal. If hit/miss generator 14 receives an end of pulse signal while the in-bin flip-flop 11 is set, an output is generated corresponding to a "hit". If counter 7 has reached full count before end of pulse occurs and thereby resets in-bin flip-flop 11, or if end of pulse occurs before in-bin flip-flop 11 is set, the hit/miss generator 14 will generate an output corresponding to a "miss".

The simplest situation occurs when it is desired to detect a single pulse having a certain predetermined pulse width. For this situation, only one code word is necessary. However, for other applications it may be necessary to detect two pulses having different pulse widths and separated by a predetermined time interval. It should be clear that this would require a minimum of three code words. It is therefore necessary that mode control unit 15 be informed of the number of steps or code words in a particular signal pattern. To achieve this, each code word contains an end of cycle bit. If this bit is zero, control counter 6 may be incremented after the current pulse width or pulse interval has been detected so that the subsequent pulse or interval in the pattern can be loaded into counter 7 and the process continued. It may be desirable, for example, not to increment the control counter and thereby load the next code word if the hit/miss generator outputs a "miss". On the other hand, in searching for a predetermined pattern of pulses, it may be desirable to increment control counter 6 if only a single miss in the pattern is detected. Further, it may be desirable to continue incrementing control counter 6, thereby varying the parameters in counter 7 until hit/miss generator 14 outputs a "hit". This process continues until either a hit is scored while the in-bin flip-flop is set and an end of cycle bit is detected or when the process is externally terminated. After sensing a "hit" and an end of cycle pulse, mode control unit 15 monitors the state of control counter 6 to determine which code word was loaded at the time end of pulse occurred, and generates an output which is applied to output select unit 16, wherein a particular output line is energized indicating what specific pulse pattern was recognized. If the in-bin flip-flop is not set when end of pulse occurs, no output line is energized, indicating that the interval is not the one sought. Depending on the mode of operation desired, the control counter 6 may either be incremented and a new interval looked for; or zeroed and the cycle reinitiated.

The output of control counter 6 is applied to the control word select decode unit 17 which, under the control of mode control unit 15, decodes the state of control counter 6. The output of control word select decode 17 enables multiplexer 18 to select the appropriate code word from memory 1.

This system offers a high degree of flexibility since reprogramming may be accomplished in a matter of 1 or 2 microseconds. This feature permits multiplexing and time sharing of the device which is particularly attractive in low duty cycle applications. For example, when a Tacan pulse pair is expected, the device can be so programmed and immediately after receipt of the pulse pair, the device can be reprogrammed to seek IFF interrogations.

The number and complexity of the signals recognized corresponds to the number of stored core words. The storage capability is easily expanded with standard RAMs or ROMs. Since each of the units described can be logically implemented, the design is extremely suitable to LSI implementation, with a good probability that the entire detector could be placed on a single chip. This would lead to extremely low equipment cost, sizes and weights, and improved performance since the device may be cascaded, both serially and in parallel. This feature permits the recognition of extremely complex pulse patterns and contributes to the solution of problems caused by overlapping signals. Further, the mode control 15, can be implemented with a RAM, increasing the flexibility of the device and allowing for "adaptive" operation, i.e., changing the action taken when hits and misses are generated.

While the principles of the invention have been described above in connection with specific apparatus, it is to be clearly understood that this description is made only by way of example and not as a limitation on the scope of the invention.

What is claimed is:

1. An apparatus for recognizing a plurality of digital signals having different pulse widths or pulse repetition intervals comprising:

a presettable digital counter;

a memory containing a plurality of binary code words, which code words contain the binary complement of the interval to be measured, said memory coupled to said presettable counter for loading said complement into said presettable counter;

means for receiving digital input signals to be measured, said digital signals including pulses and intervals between pulses;

pulse interval converter means coupled to said receiving means, said memory, and said presettable counter for inverting said digital input signal when a current code word indicates that an interval between pulses is to be measured;

logic means coupled to said presettable counter for generating a signal corresponding to an acceptable time interval within which a desired input interval must end;

means coupled to means for receiving for indicating when an input interval has terminated;

means for generating an ouput when said indication occurs during said acceptable time interval; and means for varying said acceptable time interval.

2. An apparatus according to claim 1 further including a variable clock pulse generator for controlling the rate at which said presettable counter will count.

3. An apparatus according to claim 2 wherein said logic means comprises:

a flip-flop;

first means coupled to said presettable counter and to said flip-flop for detecting a first state of said counter and setting said flip-flop; and second means coupled to said presettable counter and to said flip-flop for resetting said flip-flop when said presettable counter has reached a full count, the output of said flip-flop corresponding to said acceptable time interval.

4. An apparatus according to claim 3 wherein said digital code words contain binary information for controlling said variable clock pulse generator and said first means.

5. An apparatus according to claim 4 wherein said code word contains an indication that the last pulse of a particular pulse pattern has been received.

6. An apparatus according to claim 5 further including a control counter, coupled to said generating means; and means coupled to said control counter and to said generating means for selecting a specific code word.

* * * * *